(12) United States Patent  (10) Patent No.: US 7,456,771 B2
Liu  (45) Date of Patent: Nov. 25, 2008

(54) SIGMA-DELTA MODULATOR

(75) Inventor: Chang-Shun Liu, Taipei (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 0 days.

(21) Appl. No.: 11/735,517

(22) Filed: Apr. 16, 2007

(65) Prior Publication Data

US 2007/0247341 A1 Oct. 25, 2007

(30) Foreign Application Priority Data

Apr. 19, 2006 (TW) .............................. 95114001 A

(51) Int. Cl.
*H03M 3/00* (2006.01)

(52) U.S. Cl. ........................ 341/143; 341/118; 341/120; 341/155

(58) Field of Classification Search ......... 341/118–120, 341/143, 155

See application file for complete search history.

(56) References Cited

U.S. PATENT DOCUMENTS

| | | | | |
|---|---|---|---|---|
| 5,274,375 | A * | 12/1993 | Thompson | 341/143 |
| 5,867,116 | A * | 2/1999 | Nakamura et al. | 341/159 |
| 6,507,302 | B2 * | 1/2003 | Sakimura | 341/143 |
| 6,670,902 | B1 * | 12/2003 | Melanson et al. | 341/143 |
| 6,954,161 | B2 * | 10/2005 | Inukai et al. | 341/143 |
| 6,956,514 | B1 * | 10/2005 | Melanson et al. | 341/143 |
| 6,980,139 | B2 * | 12/2005 | Doerrer et al. | 341/118 |
| 7,298,305 | B2 * | 11/2007 | Melanson | 341/143 |
| 7,298,306 | B2 * | 11/2007 | Melanson | 341/143 |
| 2002/0140591 | A1 * | 10/2002 | Laaser | 341/143 |
| 2004/0021594 | A1 * | 2/2004 | Melanson | 341/143 |
| 2005/0116850 | A1 * | 6/2005 | Hezar et al. | 341/143 |
| 2006/0022861 | A1 | 2/2006 | Kudoh et al. | |
| 2007/0132618 | A1 * | 6/2007 | Petersen et al. | 341/143 |

FOREIGN PATENT DOCUMENTS

WO  WO02084880 A2  10/2002

OTHER PUBLICATIONS

"Analog Integrated Circuit Design" John Wiley & Sons, Inc., 1997 (ISBN 0471144487) D.A. Johns et al., pp. 445-461 and 531-547.

* cited by examiner

*Primary Examiner*—Linh V Nguyen
(74) *Attorney, Agent, or Firm*—Thomas, Kayden, Horstemeyer & Risley

(57) ABSTRACT

A sigma-delta modulator includes a first adder, a filter, a quantizer and a digital-to-analog converter. The first adder receives an input signal and an analog signal and subtracts the analog signal from the input signal to output a processed signal. The filter receives the processed signal to output a filtered signal. The quantizer receives the filtered signal to generate an output signal. The quantizer works based on a first positive reference voltage and a first negative reference voltage. The digital-to-analog converter generates the analog signal according to the output signal and outputs the analog signal to the first adder. The digital-to-analog converter works based on a second positive reference voltage and a second negative reference voltage. A difference between the first positive reference voltage and the first negative reference voltage is smaller than a difference between the second positive reference voltage and the second negative reference voltage.

12 Claims, 5 Drawing Sheets

SIGMA-DELTA MODULATOR

This application claims the benefit of Taiwan application Serial No. 095114001, filed Apr. 19, 2006, the subject matter of which is incorporated herein by reference.

BACKGROUND OF THE INVENTION

1. Field of the Invention

The invention relates in general to a sigma-delta modulator, and more particularly to a sigma-delta modulator enabling a quantizer to utilize an independent reference voltage.

2. Description of the Related Art

A sigma-delta modulator has the advantages of high resolution, simpler circuit, no additional trimming circuit required, and higher tolerance to circuit element modifications.

FIG. 1 is a block diagram showing a conventional sigma-delta modulator 100. Referring to FIG. 1, the sigma-delta modulator 100 includes an adder 110, a low-pass filter 120, a quantizer 130 and a digital-to-analog converter (D/A converter) 140. The adder 110 receives an input signal X1 and an analog signal A11 and subtracts the analog signal A11 from the input signal X1 to output a processed signal S11. The low-pass filter 120 receives the processed signal to output a filtered signal S12. The quantizer 130 receives the filtered signal S12 to generate an output signal Y1. The digital-to-analog converter 140 generates the analog signal A11 according to the output signal Y1 and outputs the analog signal A11 to the adder 110.

In an advanced application of the sigma-delta modulator, the low-pass filter 120 includes multiple integrators and generates multiple integration signals, which are summated by the adder of the low-pass filter 120 to generate the filtered signal S12.

However, the adder of the low-pass filter 120 has to take in several signals, and the equivalent loading capacitor thereof usually has to be much greater than that of the integrator. If the above-mentioned sigma-delta modulator is applied to a high-resolution audio product, the reference voltages in the circuit produce an extremely large potential difference, such as the potential difference between a voltage source Vdd and a grounding voltage Gnd. This enables the maximum output swing of the adder to approach the potential difference between the voltage source Vdd and the grounding voltage Gnd. In this case, the power-consumption of the adder circuit is considerably large. In addition, the high-speed broadband sigma-delta modulator also causes large current consumption under the requirement of the high slew rate.

SUMMARY OF THE INVENTION

The invention is directed to a sigma-delta modulator, in which different reference voltages are provided to a quantizer and a digital-to-analog converter of the sigma-delta modulator to reduce a weighting gain of an adder and the power consumption of the sigma-delta modulator.

According to the present invention, a sigma-delta modulator is provided. The sigma-delta modulator includes a first adder, a filter, a quantizer and a digital-to-analog converter. The first adder receives an input signal and an analog signal and subtracts the analog signal from the input signal to output a processed signal. The filter receives the processed signal to output a filtered signal. The quantizer receives the filtered signal to generate an output signal. The quantizer works based on a first positive reference voltage and a first negative reference voltage. The digital-to-analog converter generates the analog signal according to the output signal and outputs the analog signal to the first adder. The digital-to-analog converter works based on a second positive reference voltage and a second negative reference voltage. A difference between the first positive reference voltage and the first negative reference voltage is smaller than a difference between the second positive reference voltage and the second negative reference voltage.

The invention will become apparent from the following detailed description of the preferred but non-limiting embodiment. The following description is made with reference to the accompanying drawings.

DETAILED DESCRIPTION OF THE INVENTION

Figure 1:
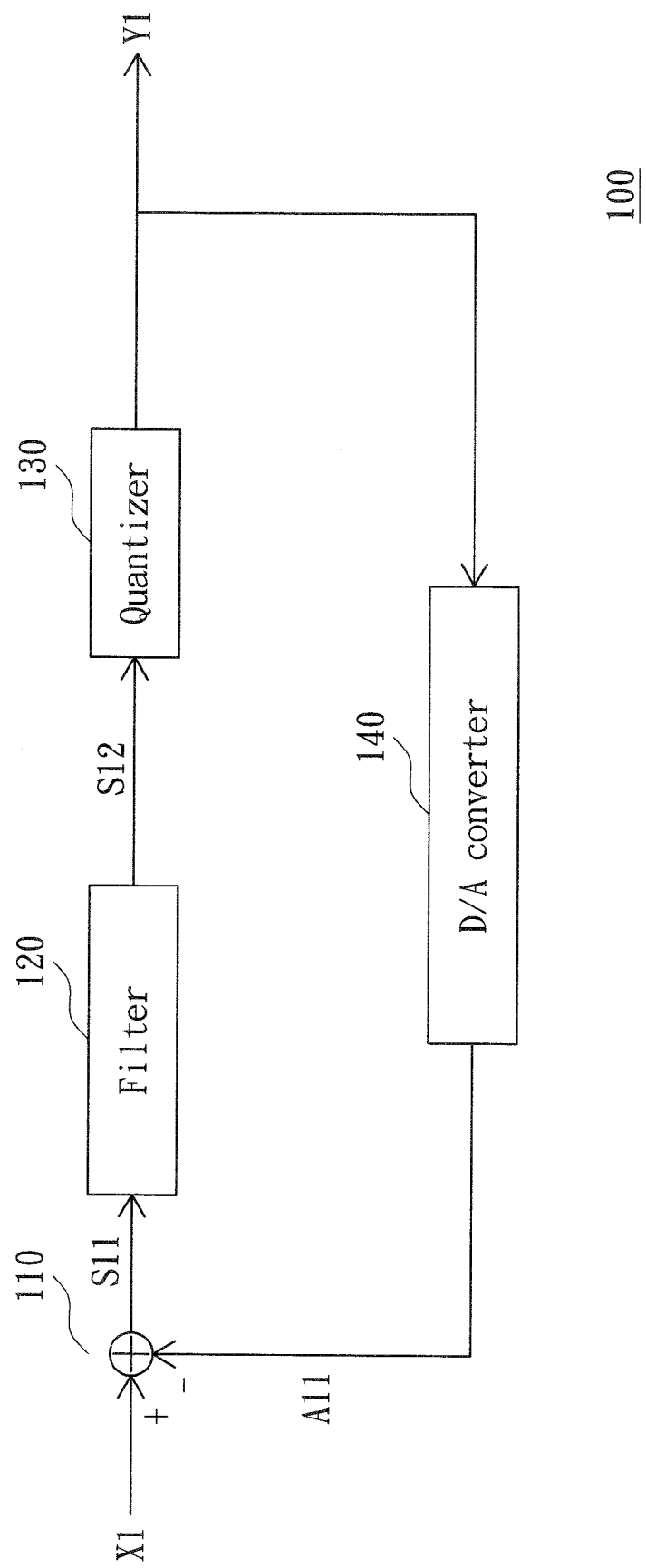
FIG. 1 (Prior Art) is a block diagram showing a conventional sigma-delta modulator.
Figure 2:
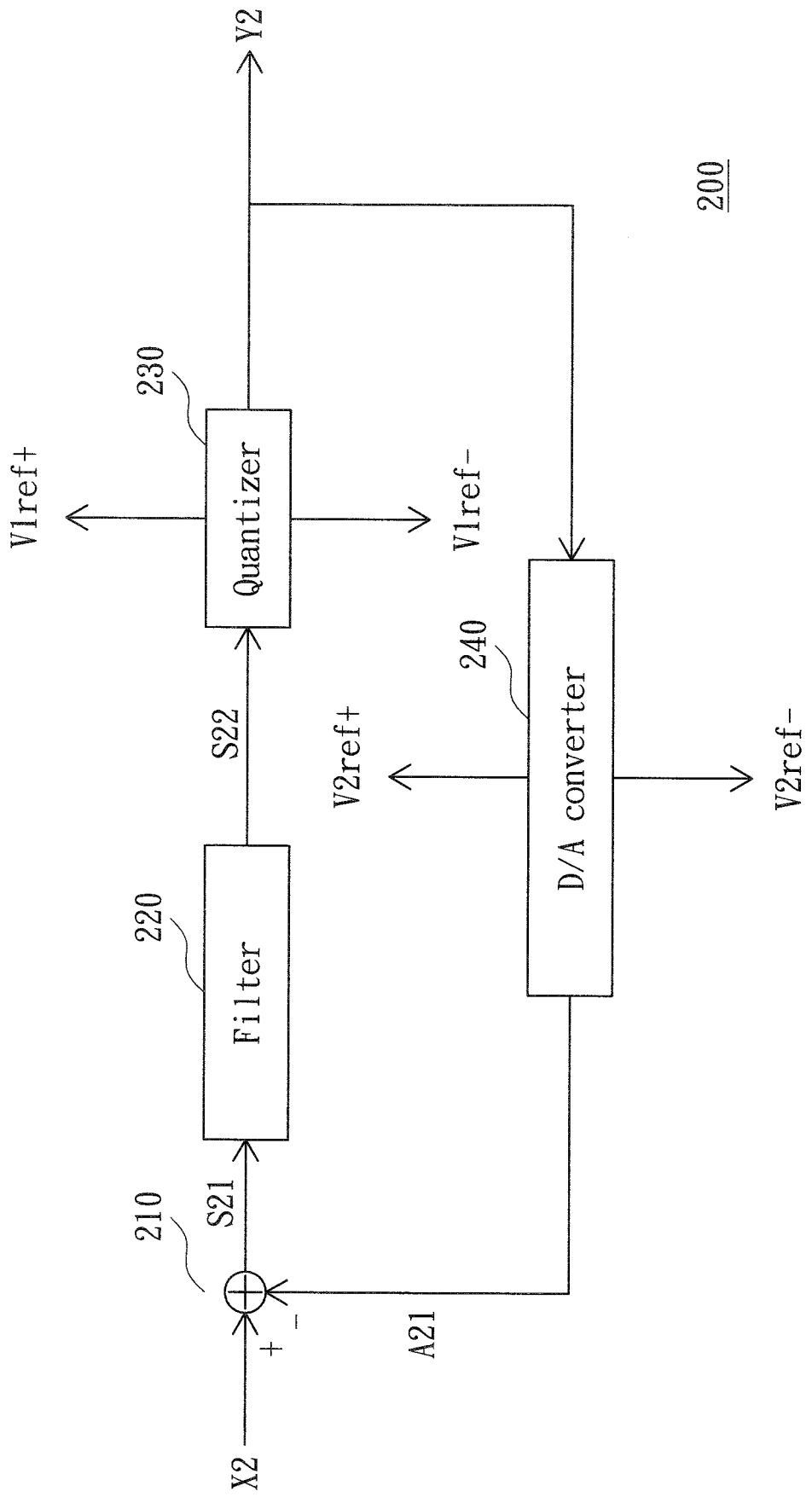
FIG. 2 is a block diagram showing a sigma-delta modulator according to a preferred embodiment of the invention.

FIG. 2 is a block diagram showing a sigma-delta modulator 200 according to a preferred embodiment of the invention. Referring to FIG. 2, the sigma-delta modulator 200 is applied to the case of a large-swing signal, such as an audio signal, which may include an adder 210, a filter 220, a quantizer 230 and a digital-to-analog converter (D/A converter) 240. The adder 210 receives an input signal X2 and an analog signal A21 and generates a processed signal S21. The filter 220 receives and filters the processed signal S21 to generate and output a filtered signal S22. The quantizer 230 receives the filtered signal S22 to generate an output signal Y2. The quantizer 230 operates in accordance with a first positive reference voltage V1ref+ and a first negative reference voltage V1ref−.

The digital-to-analog converter 240 generates the analog signal A21 according to the output signal Y2 and transfers the analog signal A21 to the adder 210 and operates on a second positive reference voltage V2ref+ and a second negative reference voltage V2ref−. The difference Di1 between the first positive reference voltage V1ref+ and the first negative reference voltage V1ref− is K times the difference Di2 between the second positive reference voltage V2ref+ and the second negative reference voltage V2ref−, where K<1.

Figure 3:
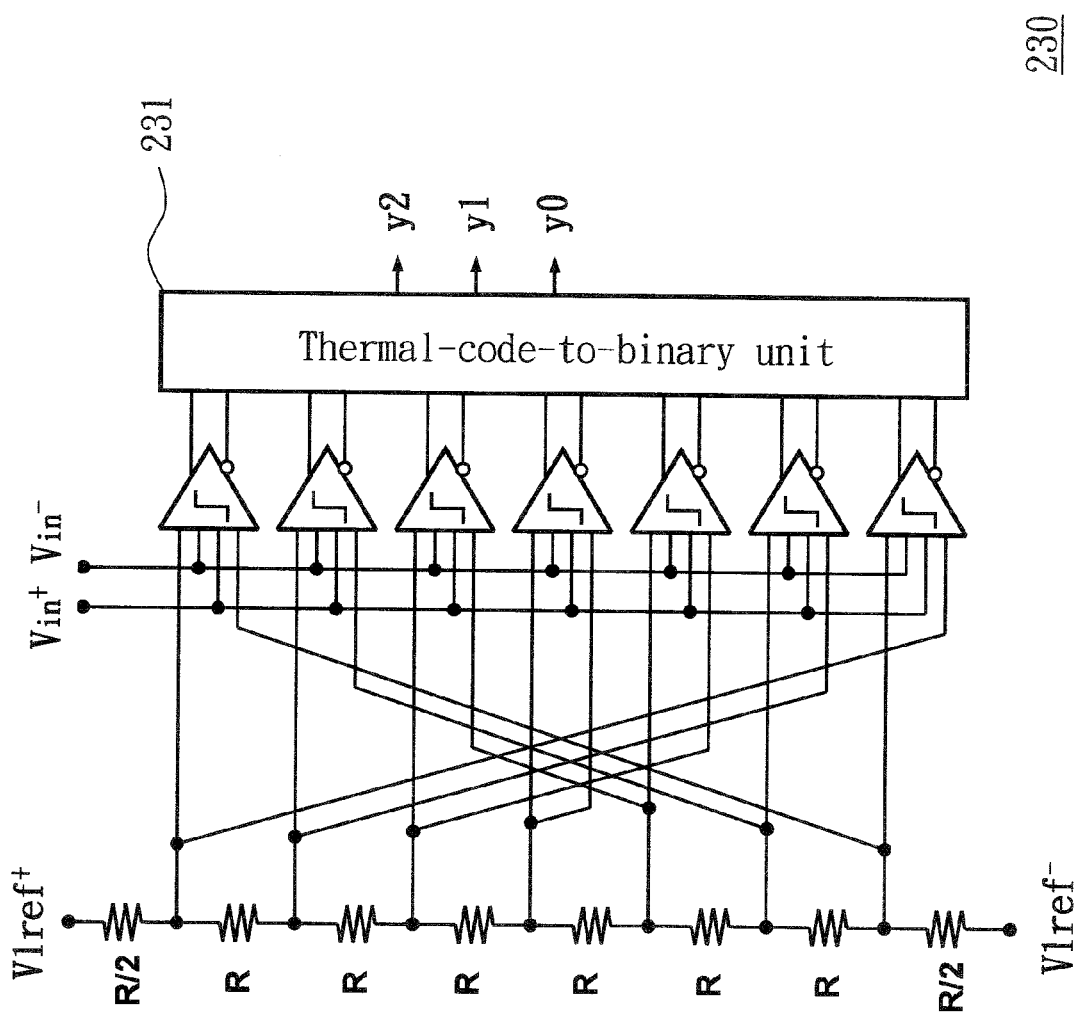
FIG. 3 is a circuit diagram showing that a quantizer 230 is a three-bit quantizer.

FIG. 3 is a circuit diagram showing a three-bit quantizer 230, for example. As shown in FIG. 3, the filtered signal S22 received by the quantizer 230 of this embodiment is represented by the signals Vin+ and Vin−, and the serial resistors divide the voltage between the first positive reference voltage V1ref+ and the first negative reference voltage V1ref− into multiple sets of divided voltages. Comparators compare values of the signals Vin+ and Vin− with the divided voltages generated by the serial resistors and produce thermal codes which then entered a thermal-code-to-binary unit 231 to generate a 3-bit output signal Y2. The output signal Y2 uses the signals y0, y1 and y2 to represent each bit.

Figure 4:
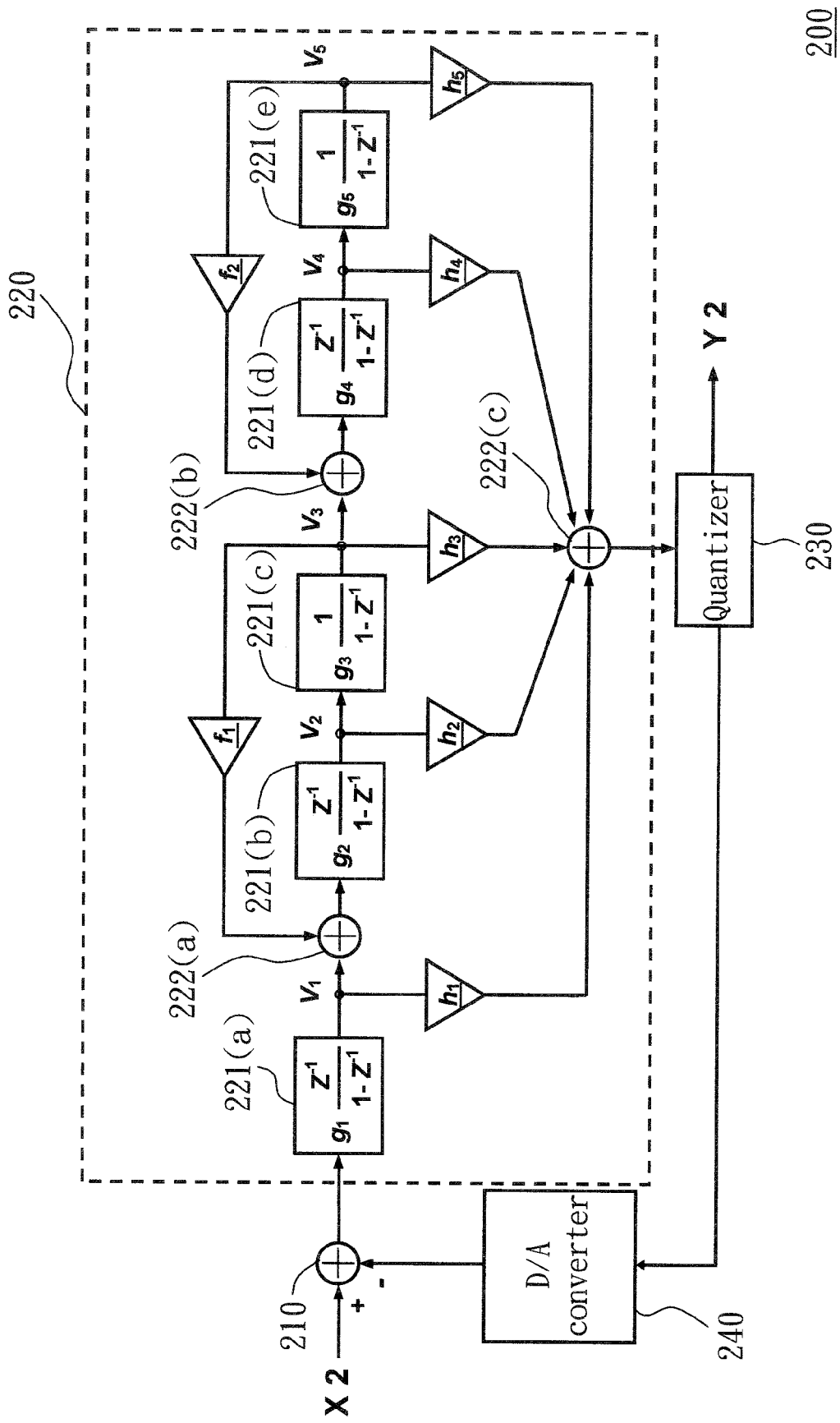
FIG. 4 is a circuit diagram showing a filter 220 when a sigma-delta modulator 200 is a five-order feed-forward sigma-delta modulator.

The filter 220 of this embodiment, such as a low-pass filter, a band-pass filter or a high-pass filter, includes one integrator or multiple integrators, and one gain amplifier or multiple gain amplifiers. Each integrator may be, for example, a discrete-time integrator so that an Nth-order discrete integration circuit can be formed, where N is a positive integer. FIG. 4 is a circuit diagram showing the filter 220 when the sigma-delta modulator 200 is a fifth-order feed-forward sigma-delta modulator. Referring to FIG. 4, the filter 220 includes gain amplifiers f1, f2, h1, h2, h3, h4 and h5, integrators 221(a), 221(b), 221(c), 221(d) and 221(e), and adders 212(a), 212(b) and 212(c).

The gain amplifier h1 receives the integration signal outputted from the integrator 221 (a), amplifies the integration signal according to its default weighting coefficient to generate an amplified integration signal, and then inputs the amplified integration signal to the adder 212(c). The gain amplifier h2 receives the integration signal outputted from the integrator 221(b), amplifies the integration signal according to its default weighting coefficient to generate an amplified integration signal, and then inputs the amplified integration signal to the adder 212(c). The gain amplifier h3 receives the integration signal outputted from the integrator 221 (c), amplifies the integration signal according to its default weighting coefficient to generate an amplified integration signal, and then inputs the amplified integration signal to the adder 212(c). The gain amplifier h4 receives the integration signal outputted from the integrator 221 (d), amplifies the integration signal according to its default weighting coefficient to generate an amplified integration signal, and then inputs the amplified integration signal to the adder 212(c). The gain amplifier h5 receives the integration signal of the integrator 221 (e), amplifies the integration signal according to its default weighting coefficient to generate an amplified integration signal, and then inputs the amplified integration signal to the adder 212 (c). The adder 212(c) summates the amplified integration signals to generate the filtered signal S22.

When the quantizer 230 retains the output signal Y2 at the same digital code, the large current supplied under the same positive/negative reference voltage in the prior art are prevented and thus reduces the power-consumption since the difference Di1 between the first positive reference voltage V1ref+ and the first negative reference voltage V1ref− is smaller than the difference Di2 between the second positive reference voltage V2ref+ and the second negative reference voltage V2ref−. The gain amplifier of the filter 220 amplifies the integration signals by K times to match with the conditions that the difference Di1 is K times of the difference Di2, where K<1.

Compared with the prior art method, the quantizer 230 uses a reference voltage different from that of the digital-to-analog converter 240. Hence, the amplitude of the filtered signal S22 outputted from the adder 222(c) has to be reduced in correspondence with the range from the first positive reference voltage V1ref+ to the first negative reference voltage V1ref− of the quantizer 230, and the gains of the gain amplifiers h1 to h5 should be configured such that the amplitude of the filtered signal S22 also falls within this range. That is, the gains of the gain amplifiers h1 to h5 have to be reduced in correspondence with the first positive reference voltage V1ref+ and the first negative reference voltage V1ref− of the quantizer. In this embodiment, the first positive reference voltage V1ref+ and the first negative reference voltage V1ref− may be configured to be symmetrically relative to a common mode voltage, and the second positive reference voltage V2ref+ and the second negative reference voltage V2ref− may be configured to be symmetrically relative to another common mode voltage.

Figure 5:
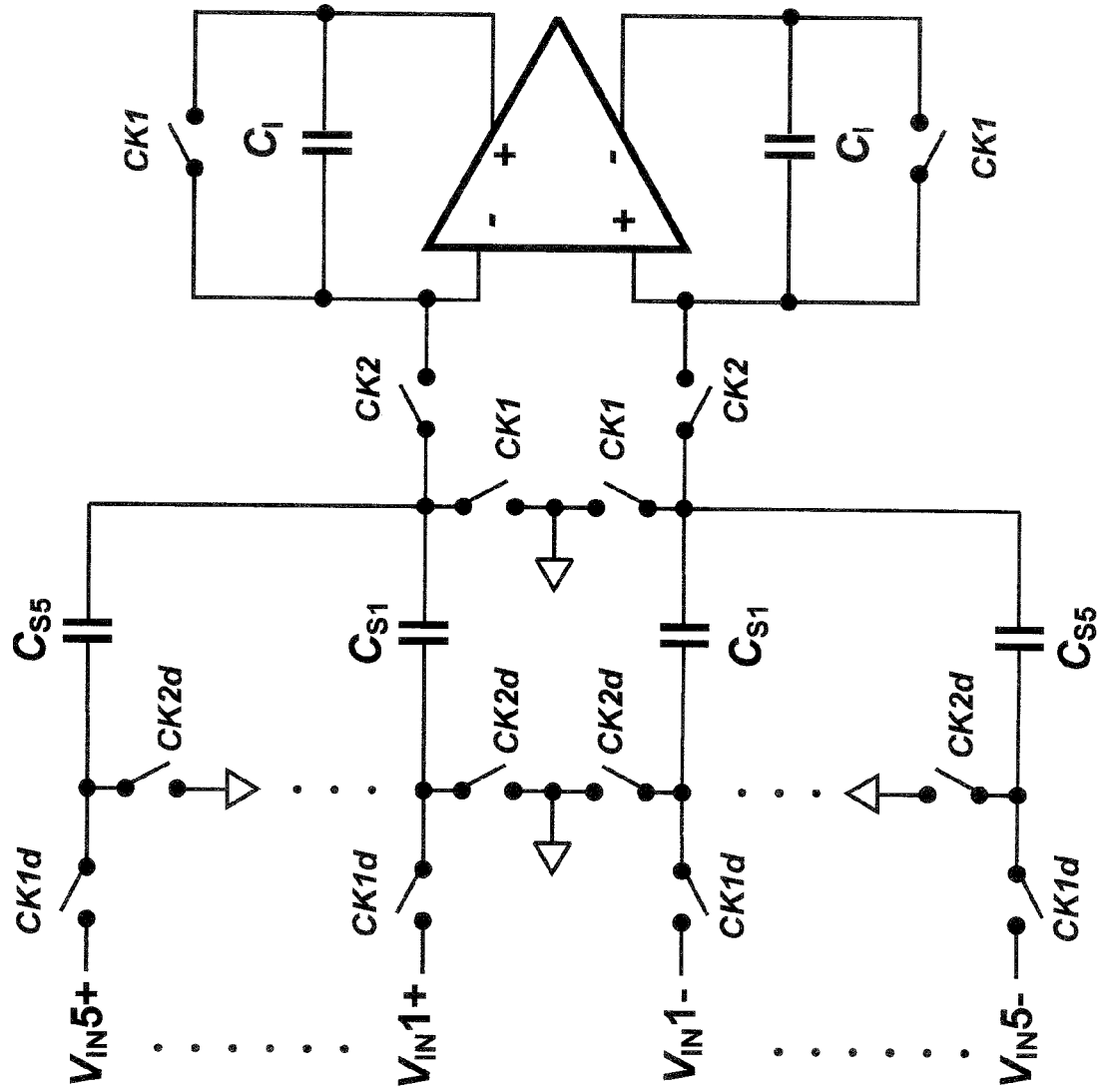
FIG. 5 is a circuit diagram showing an example of an adder 210 and the low-pass filter 220.

FIG. 5 is a circuit diagram showing an example of the adder 210 and the low-pass filter 220. Referring to FIG. 5, the circuit includes capacitors C1, $C_{S1}$, $C_{S2}$, $C_{S3}$, $C_{S4}$ and $C_{S5}$ and switches CK1, CK1d, CK2 and CK2d. The input signals are $V_{IN}1+$ to $V_{IN}5+$ and $V_{IN}1-$ to $V_{IN}5-$, the potentials of the input signals are respectively stored in the capacitors $C_{S1}$ to $C_{S5}$ when the switches CK1, CK1d, CK2 and CK2d are turned on. Subsequently, the capacitor C1 receives a sum of potentials of other capacitors, and finishes the filtering process in conjunction with the switches. Similar to the above-mentioned condition, the signal has to be amplified K times in correspondence with the smaller reference voltage of the quantizer 230, where K<1. In this circuit, capacitances of the capacitors $C_{S1}$, $C_{S2}$, $C_{S3}$, $C_{S4}$ and $C_{S5}$ are reduced in order to reduce the signal gain. Thus, the area is reduced and the power consumption is also lowered so that the circuit are designed more easily and the cost of the circuit can be reduced.

In the sigma-delta modulator according to the embodiment of the invention, the quantizer utilizes the independent and lower reference voltage so that the weighting gain in the filter is also correspondingly reduced to hold the same output of the digital code. The output swing of the adder can be decreased greatly without influencing the operation of the modulator so that the power-consumption can be reduced. In addition, conditions that require large-current consumption man, also be reduced under the requirement of high slew rates.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sigma-delta modulator, comprising:
   an adder for receiving an input signal and an analog signal, and generating a processed signal;
   a filter for receiving the processed signal and analog a filtered signal, comprising:
   at least one integrator for outputting at least one integration signal;
   at least one gain amplifier for amplifying the at least one integration signal to generate at least one amplified integration signal according to at least one default weighting coefficient assigned to each of the at least one gain amplifier; and
   a second adder for receiving and summating the at least one amplified integration signal and outputting the filtered signal;
   a quantizer for receiving the filtered signal to generate an output signal, wherein the quantizer operates in accordance with a first voltage difference; and
   a digital-to-analog converter for generating the analog signal according to the output signal, wherein the digital-to-analog converter operates in accordance with a second voltage difference;
   wherein the first voltage difference is K times of the second voltage difference and the at least one gain amplifier further amplifies the at least one integration signal by K times according to the first voltage difference and the second voltage difference, and K is smaller than 1.

2. The modulator according to claim 1, wherein the first voltage difference is a difference between a first positive reference voltage and a first negative reference voltage.

3. The modulator according to claim 2, wherein the first positive reference voltage and the first negative reference voltage are symmetrical relative to a common mode voltage.

4. The modulator according to claim 1, wherein the second voltage difference is a difference between a second positive reference voltage and a second negative reference voltage.

5. The modulator according to claim 4, wherein the second positive reference voltage and the second negative reference voltage are symmetrical relative to a common mode voltage.

6. The modulator according to claim 1, wherein the integrator is a discrete-time integrator.

7. The modulator according to claim 1, wherein the filter is a low-pass filter.

8. The modulator according to claim 1, wherein the filter is a band-pass filter.

9. The modulator according to claim 1, wherein the filter is a high-pass filter.

10. The modulator according to claim 1 being applied to a large-swing signal.

11. The modulator according to claim 10, wherein the large-swing signal is an audio signal.

12. The modulator according to claim 1, wherein the filter comprises an Nth-order discrete-time integration circuit, and N is a positive integer.

* * * * *